(12) United States Patent
Miyasaka et al.

(10) Patent No.: US 6,999,828 B2
(45) Date of Patent: Feb. 14, 2006

(54) PARALLEL SIGNAL PROCESSING DEVICE FOR A PORTABLE AUDIO SYSTEM

(75) Inventors: Shuji Miyasaka, Neyagawa (JP); Takeshi Norimatsu, Kobe (JP); Mineo Tsushima, Katano (JP); Tomokazu Ishikawa, Toyonaka (JP); Yoshiaki Sawada, Moriguchi (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 447 days.

(21) Appl. No.: 09/741,912

(22) Filed: Dec. 22, 2000

(65) Prior Publication Data

US 2001/0021879 A1    Sep. 13, 2001

(30) Foreign Application Priority Data

Dec. 24, 1999    (JP)    ................. 11-367168

(51) Int. Cl.
*G06F 17/00* (2006.01)
*G10L 21/00* (2006.01)

(52) U.S. Cl. ............... 700/94; 704/500; 704/503
(58) Field of Classification Search ........... 700/94, 700/500, 43; 712/28, 34, 35, 41, 36, 31, 712/22, 235, 215; 34/65; 709/201, 105, 709/106; 381/22, 23; 718/105; 713/600, 713/375

See application file for complete search history.

(56) References Cited

U.S. PATENT DOCUMENTS

| | | | |
|---|---|---|---|
| 4,351,025 A * | 9/1982 | Hall, Jr. ................ 703/21 |
| 5,237,686 A * | 8/1993 | Asano et al. ............. 718/105 |
| 5,744,693 A | 4/1998 | Meyerowitz et al. | |
| 5,883,671 A * | 3/1999 | Keng et al. ............ 375/240.1 |
| 5,911,082 A * | 6/1999 | Monroe et al. ............. 712/35 |
| 5,960,401 A * | 9/1999 | Rao et al. ............... 704/500 |
| 5,978,831 A * | 11/1999 | Ahamed et al. .......... 718/105 |
| 6,009,205 A * | 12/1999 | Yoshida ................. 382/246 |
| 6,061,306 A * | 5/2000 | Buchheim ................. 369/2 |
| 6,363,176 B1 * | 3/2002 | Numata ................. 382/233 |
| 6,581,153 B1 * | 6/2003 | Matt et al. ............... 712/35 |

OTHER PUBLICATIONS

Pohlmann, "Principles of Digital Audio", 1995, McGraw-Hill, Inc. 3rd Edition, pp. 386-388.*
"Effective INTER-Parallel Schemes for Compression/Decompression Speed-Up", IBM Technical Disclosure Bulletin, Apr. 1997. vol. 40, Issue 4, pp 157-165.*
R. Yamaguchi et al., "A single chip AV decoder for the DVD player adopting the MCP architecture", IEEE 1998 Custom Integrated Circuits Conference, 1998, pp 185-188.
Leung, J. et al. "Performance Analysis of Automatic Assembly Systems with in-line Parallel Stations", IMA Journal of Mathematics Applied in Business and Industry, 1997, pp. 1-22, vol. 8.

(Continued)

*Primary Examiner*—Vivian Chin
*Assistant Examiner*—Andrew Graham
(74) *Attorney, Agent, or Firm*—Smith Patent Office

(57) ABSTRACT

The present invention is a signal processing device which performs parallel processes A and B efficiently. There is a deviation in the throughputs of the process A and B in processing an audio signal. First to Nth sub signal processing sections have capabilities to complete the process A within a period (N×T). A main signal processing sections has a capability to complete the process B within a period T. Efficient signal processing can be achieved by processing an input digital signal by means of distinct sub signal processing devices one after another and then processing the signal by the main signal processing section. (N×T).

10 Claims, 17 Drawing Sheets

OTHER PUBLICATIONS

Kuroda, I. et al. "Multimedia Processors", Proceedings of the IEEE, Jun. 1998, pp. 1203-1221, vol. 86, No. 6, IEEE, New York.

Iwata, E. et al. "Exploiting Coarse-Grain Parallelism in the MPEG-2 Algorithm", Technical Report TR-98-771, Sep. 1998, pp. 1-13, Stanford University, Computer Systems LAB Retrieved from the Internet.

Mesarovic, V. et al. "DTS Multichannel Audio Decoder on a 24-Bit Fixed-Point Dual-DSP Architecture" AES 106th Convention Preprint, May 8, 1999, pp. 1-4, No. 4964.

* cited by examiner

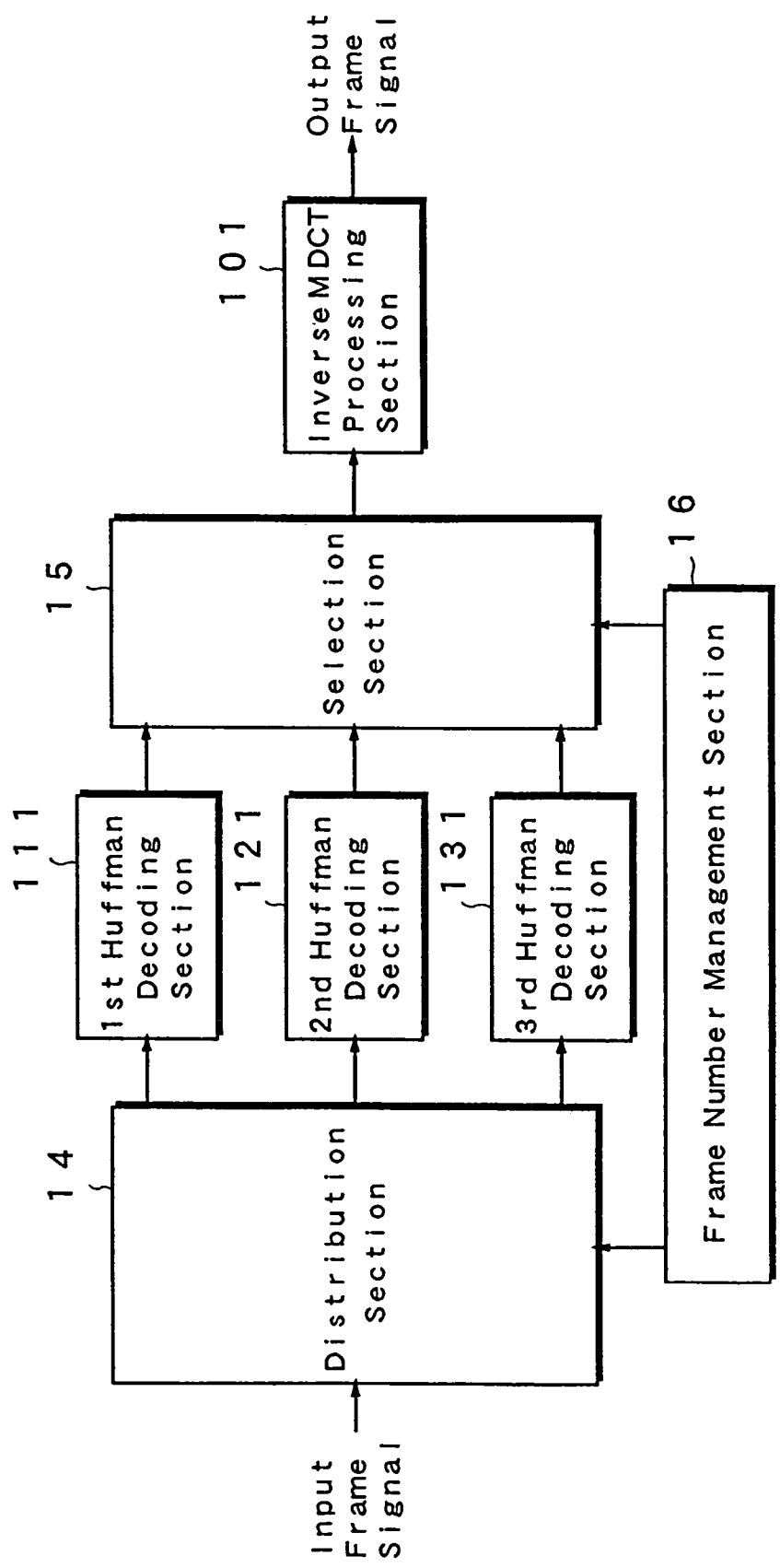
F I G. 6

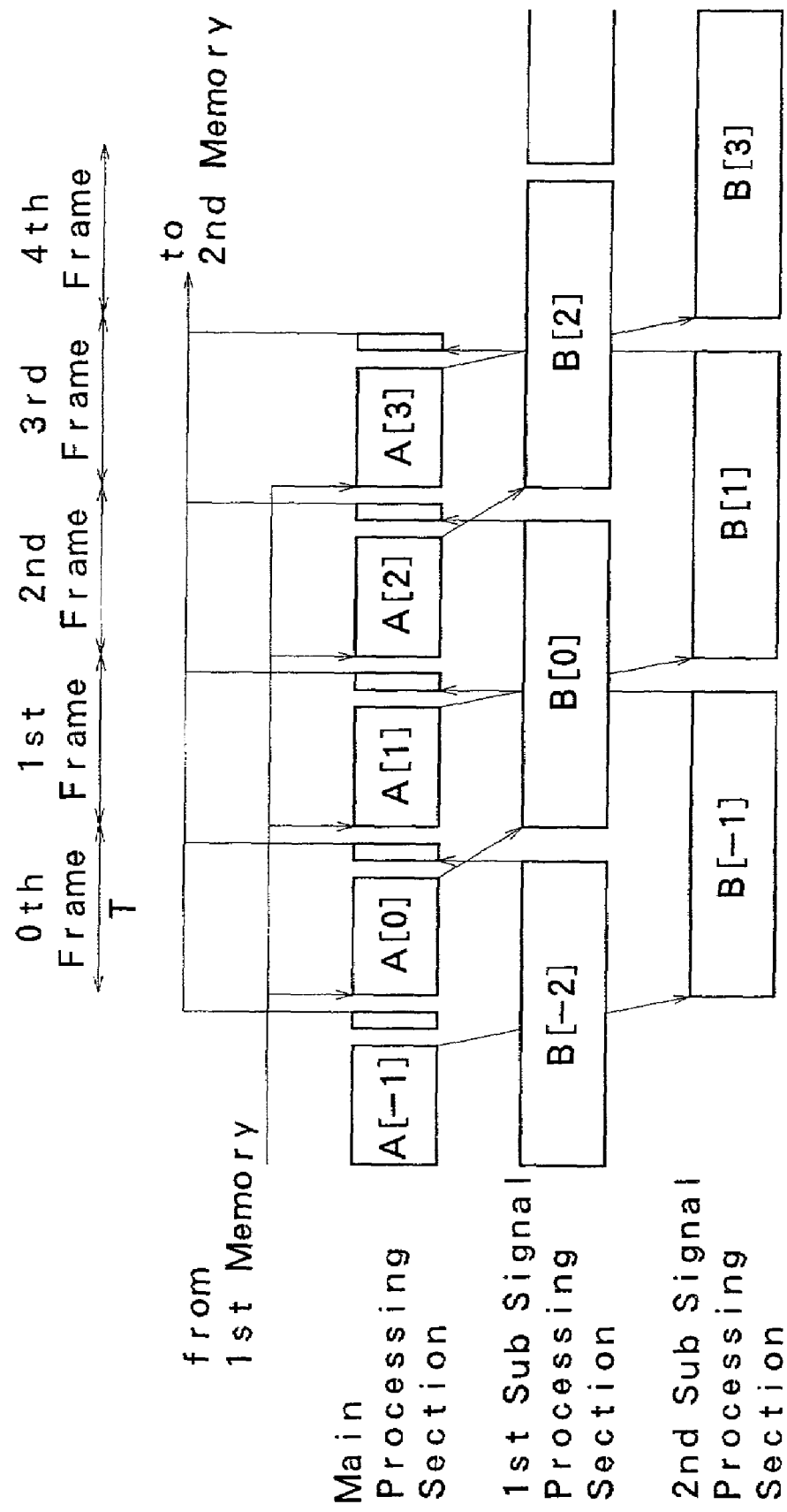

F I G. 1 7
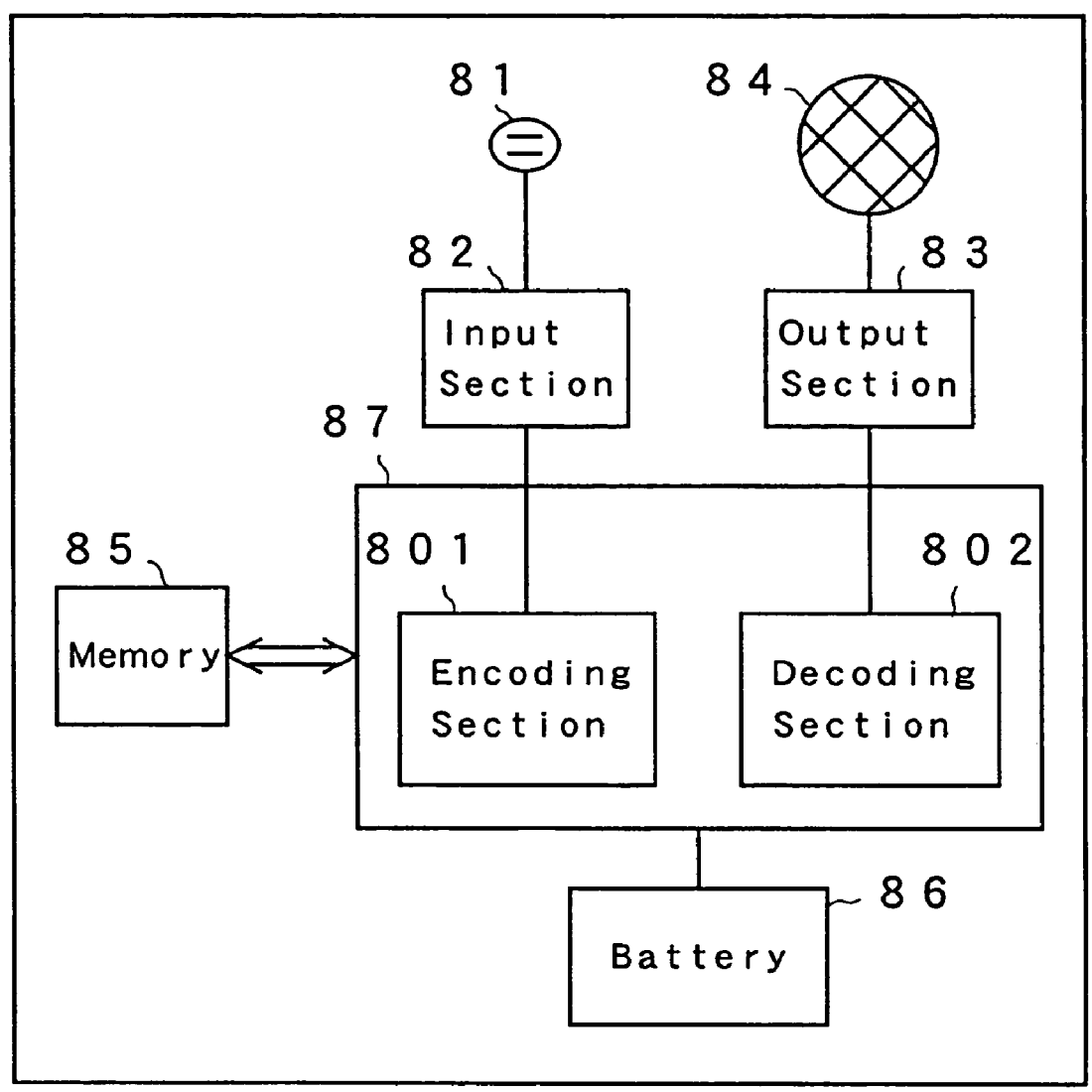

PARALLEL SIGNAL PROCESSING DEVICE FOR A PORTABLE AUDIO SYSTEM

BACKGROUND OF THE INVENTION

1. Field of the Invention

The present invention relates to a signal processing device and a signal processing method performing a compressing/decoding process for an audio signal, and more specifically to a signal processing device and method in which the power consumption is reduced by making the processing parallel.

2. Discussion of the Related Art

Recently, for the sake of recording, downloading, and the like of an audio signal, techniques for a compressing/decoding process for a number of audio signals have been developed rapidly. As these types of compressing/decoding process techniques, Layer 3 of MPEG/AUDIO (MP3), Advanced Audio Coding (AAC), and the like are known. Any of these employs technologies, such as subhand encoding, MDCT, quantization, Huffman encoding, and the like, as elemental technologies.

SUMMARY OF THE INVENTION

The present invention is to provide a signal processing device in which the power consumption can be reduced effectively even when there is a deviation in the throughputs of plural processes when a low power consumption is sought by making the processing of an audio signal parallel and pipelined.

The present invention is a signal processing device having first to Nth sub signal processing sections and a main signal processing section and converting a first digital signal to a second digital signal by performing a second process after performing a first process for each frame signal of the first digital signal which is framed for each predetermined time interval.

Here, the first to Nth sub signal processing sections can be those to which a (N×t+i)th frame signal (i and t are integers, N is a natural number, and $0 \leq i < N$) of the first digital signal is given, wherein each of the sections completes the first process within a time period (N×T) (T is a real number). The main signal processing section can be the one which completes the second process within a time period T for the signal processed in the (i+1)th sub signal processing section.

The main signal processing section may be the one to which a (N×t+i)th frame signal (i and t are integers, $0 \leq t$, and $0 \leq i < N$) of the first digital signal is given and which completes the first process within a time period T (T is a real number). The first to Nth sub signal processing sections may be those to which the (i+1)th frame signals are given after processed in the main signal processing section, respectively, and each of which completes the second process within the time period (N×T) (N is a natural number).

BRIEF DESCRIPTION OF THE DRAWINGS

FIG. 6 is a block diagram showing a signal processing device performing audio signal decoding in accordance with the concrete example of Embodiment 1.

FIG. 16 is a time chart showing a flow of the signal processing of Embodiment 4 of the present invention in order of time.

FIG. 17 is an outlined view showing one example of a portable type apparatus containing a signal processing device in accordance with the present invention.

DETAILED DESCRIPTION OF THE PREFERRED EMBODIMENTS

Figure 1:
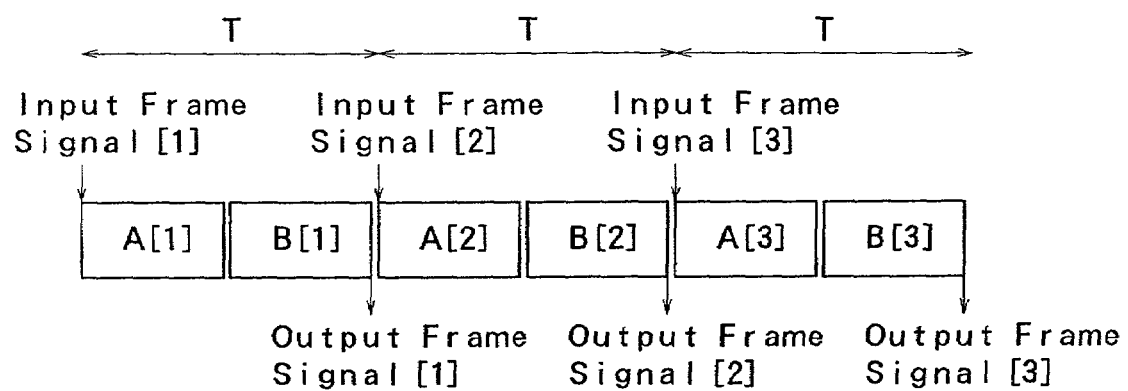
FIG. 1 is a view showing a flow of signal processing in the case where parallel processing in an audio signal processing device is not performed.
Figure 2:
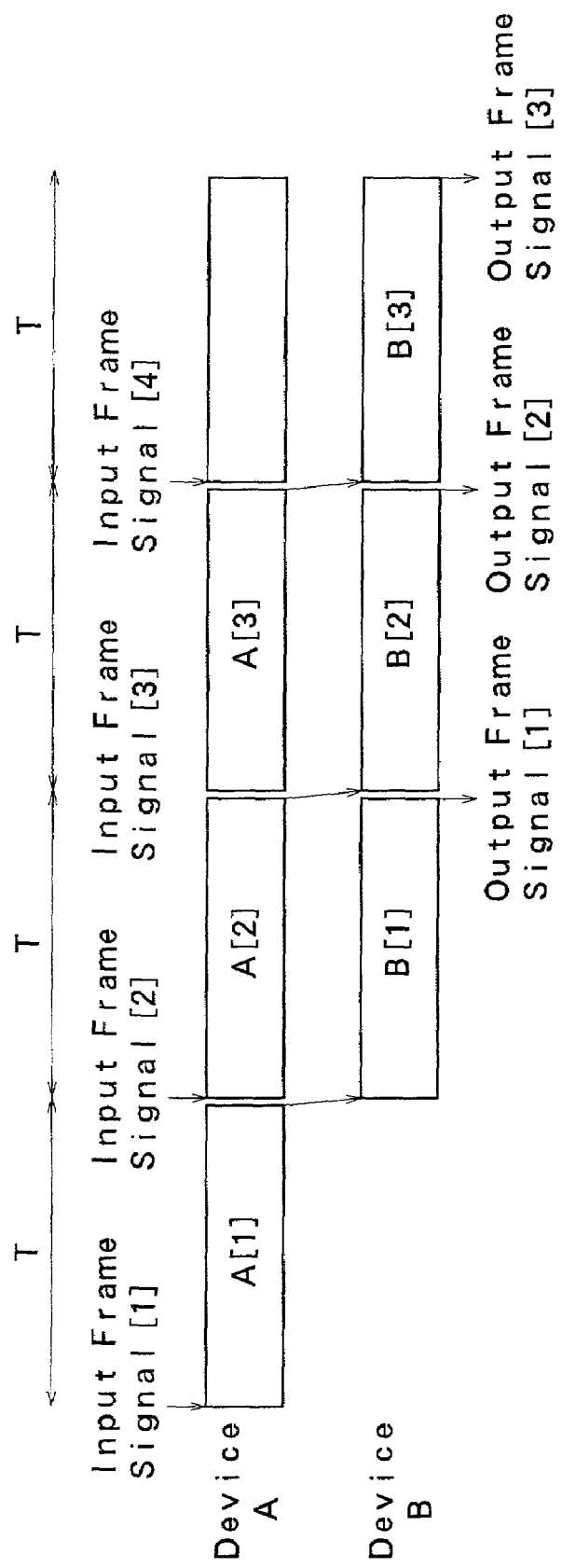
FIG. 2 is a view showing a flow of signal processing in the case where parallel processing in an audio signal processing device is performed.

FIG. 1 shows a flow of processing in the case where signal processing composed of a first process A and a second process B is performed without being made parallel in a signal processing device. FIG. 2 shows a flow of the process A and the process B in the case where the processing shown in FIG. 1 is made parallel. In these examples, one frame period is T. When the processing is not made parallel, first, the first process A [1] is performed for an input frame signal [1] as shown in FIG. 1, and then the second process B [1] is performed to generate an output frame signal [1]. In the next frame period, the process A [2] is performed for an input frame signal [2], and then the process B [2] is performed to generate an output frame signal [2]. Thus, the processing of the process A and the process B is completed together within the one frame period T.

When processing is made parallel, two processing devices A, B are employed. The process A [1] is performed for the input frame signal [1] in the processing device A, taking the period T, as shown in FIG. 2. In the next frame period, The process A [2] is performed for the input frame signal [2] in the processing device A, taking the period T. In this frame period, the process B [1] is performed for the signal being after the process A [1] is finished in the processing device B, taking the period T. This type of processing is repeated for each frame period so that the processing of the process A and the process B is made parallel.

With this parallel processing, although both the process A and the process B together have to be completed within the period T originally as shown in FIG. 1, it becomes possible that each one of the process A and the process B is completed within the period T, whereby ½ of calculation capability becomes sufficient. That is, the operation frequency for the processing can be made in half, and thus the power consumption is reduced.

Figure 3:
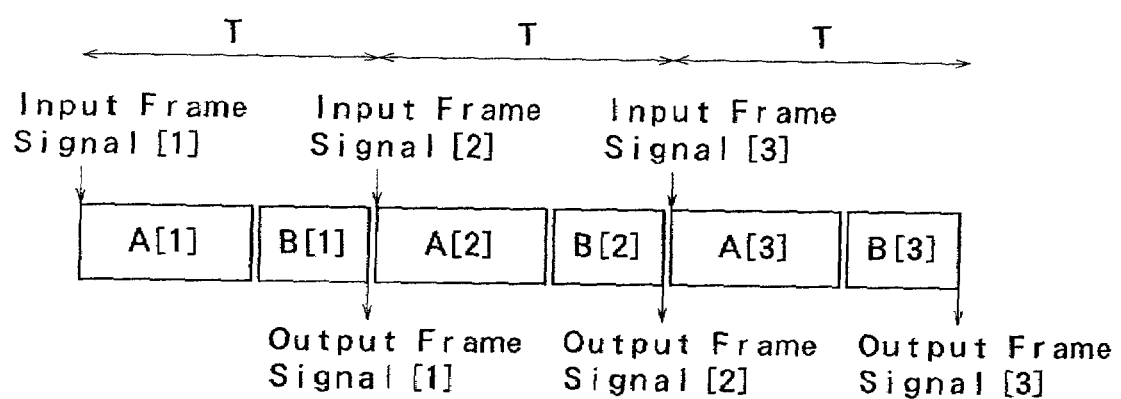
FIG. 3 is a view showing a flow of signal processing in the case where parallel processing is not performed when there is a deviation in the throughputs of processes A and B in an audio signal processing device.
Figure 4:
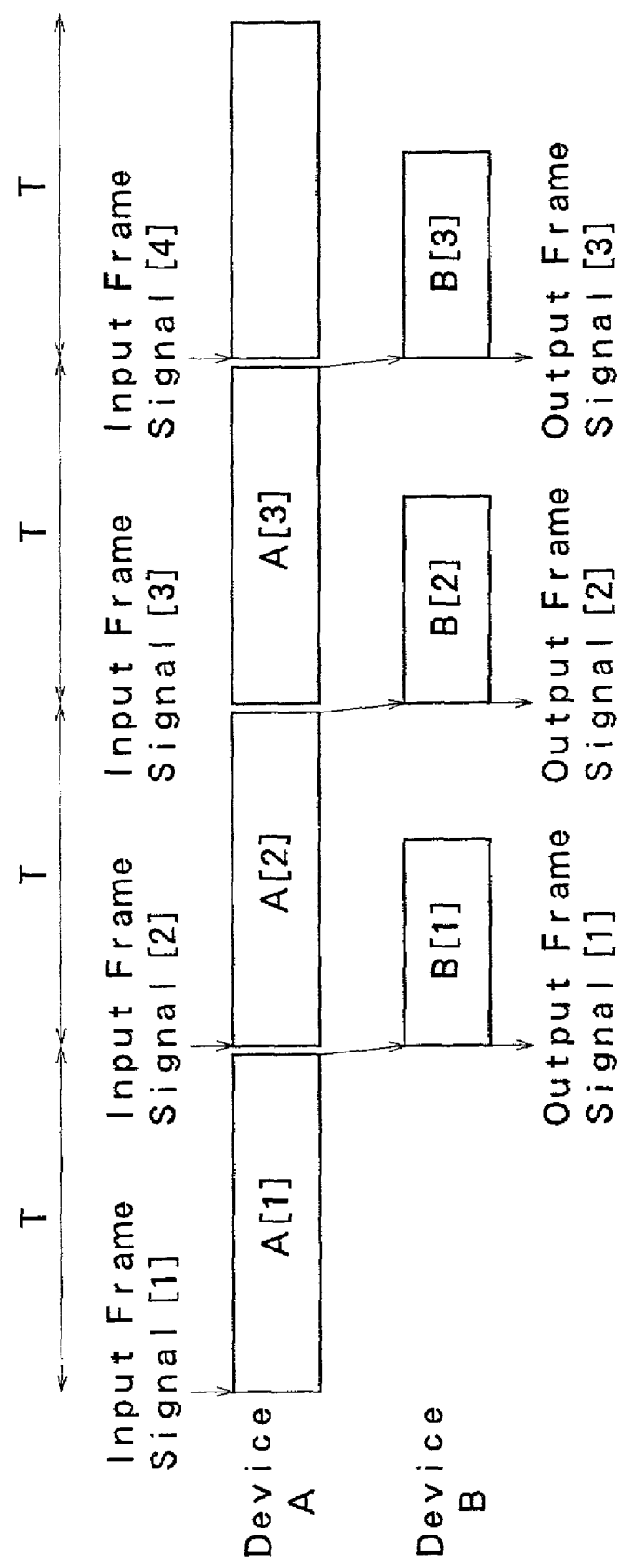
FIG. 4 is a view showing a problem in the case where parallel processing is performed in an audio signal processing device.

If there is a deviation in the throughputs of the process A and the process B, it is necessary to complete both the processes A and B within one frame period T as shown in FIG. 3 unless the process A and the process B are made parallel. FIG. 4 shows a flow of the processing in the case where parallel processing is employed when the processing amount of the process A is double the processing amount of the process B. In this case, first, the process A [1] is performed for the input frame signal [1] in the processing device A, taking the period T, as shown in FIG. 4. In the next frame period, the process A [2] is performed for the input frame signal [2] in the processing device A, taking the period T. In this frame period, the process B [1] is performed for the signal which exists after the process A [1] is finished in the processing device B, taking the period T/2.

Although the process A and the process B are performed in parallel as described above, in this type of parallel processing, the processing in which the process A is originally completed within a period 2×T/3 merely comes to be allowed to be completed within a maximum of the period T. With respect to the process B, the process is completed in a sufficiently short period, compared with the given period T. Therefore, dead time in which no processing is performed is generated in the processing device B, and thus reduction in power consumption cannot be executed efficiently even by the parallel processing. The inventors found out and solved the problem in the case where the audio signal processing is made parallel.

(Embodiment 1)

In the present embodiment, explained is a signal processing device which is intended for an audio signal and performs a first process A and then a second process B for a frame input signal that is a first digital signal of an input framed for each time period T (T is a real number) to generate a frame signal that is a second digital signal of an output. Here, the embodiment is explained in the setting that the processing amount of the process A is N times (N is a natural number, here, N=3) the processing amount of the process B.

Figure 5:
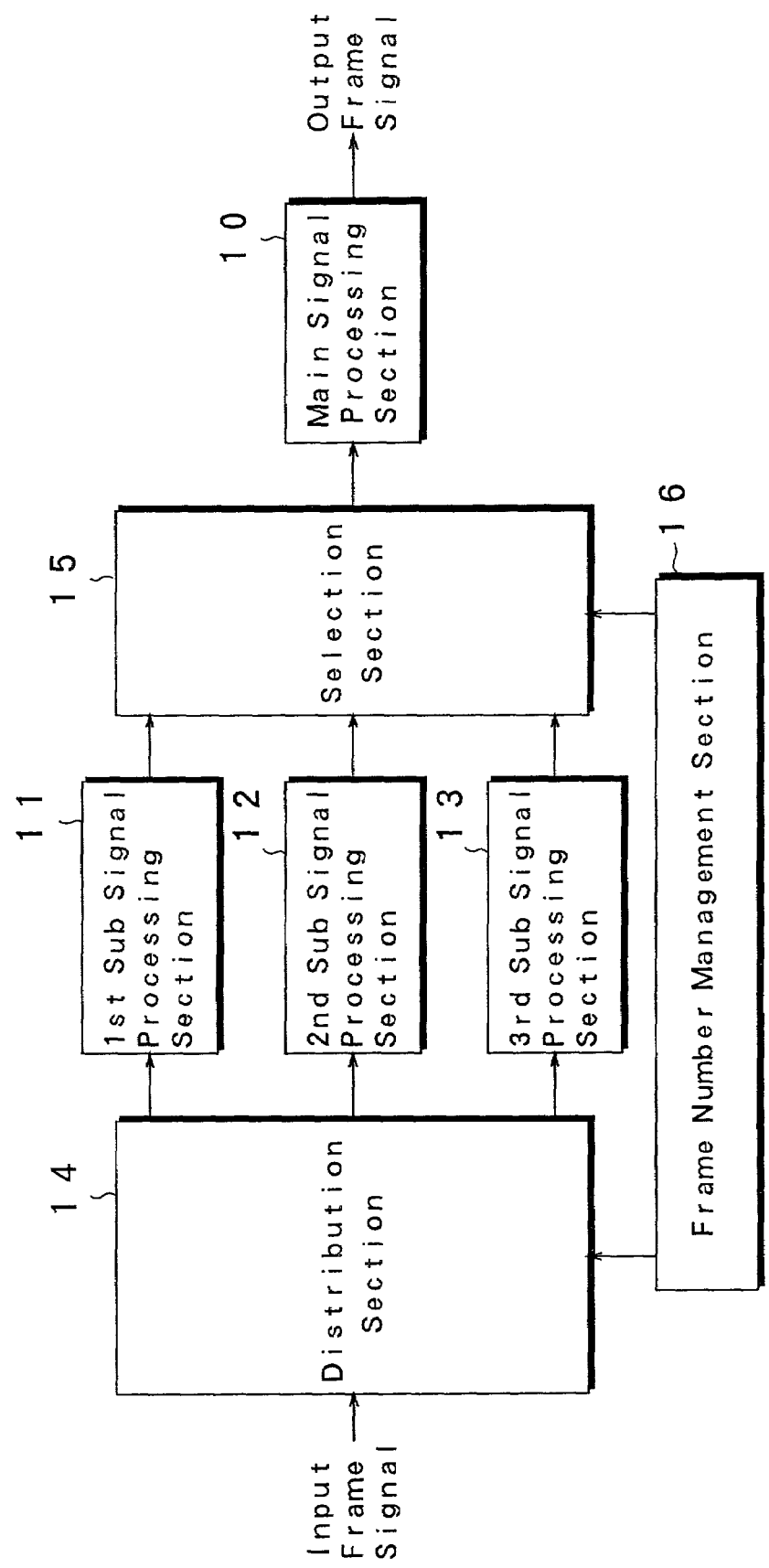
FIG. 5 is a block diagram showing a configuration of a signal processing device of Embodiment 1 of the present invention.

FIG. 5 shows a configuration of a signal processing device according to the present embodiment. This signal processing device has one main signal processing section 10 and first to third three sub signal processing sections 11 to 13. A distribution section 14 distributes a frame signal of the input to one of the sub signal processing sections 11 to 13 in accordance with a frame number. A selection section 15 selects one of the sub signal processing sections 11 to 13 in accordance with the frame number to send it to the main signal processing section 10. A frame number management section 16 updates the frame number each time one frame period T elapses to give the number to the distribution section 14 and the selection section 15. Here, it is supposed that the respective sub signal processing sections 11 to 13 have the capabilities to process the first process A within the time period 3×T, and the main signal processing section 10 has the capability to process the process B within the time period T.

Here, since the first process A has to start the process of the next frame time before the processing of the past frame time is completed, it is necessary that the process A is a non-chain process, that is, a process in which the information generated in the past frame time is not employed. Conversely, the second process B can be a process in which the information generated in the past frame time is employed, that is, a chain process. This is because the processing of the next frame time is always started after the processing of the past frame time is completed.

The first digital signal may, for example, be a compressed and encoded signal of an audio signal, and the second digital signal may be a PCM signal of an audio signal. The first process may contain a process picking out information from that compressed and encoded signal and converting that information into the information of a frequency spectrum, and the second process may contain a process converting the information of that frequency spectrum into a time based PCM signal.

FIG. 6 is a block diagram showing a signal processing device performing an audio signal decoding process that is a concrete example of the present signal processing device. This audio signal decoding processing device has first to third Huffman decoding sections 111, 121, and 131 as the sub signal processing sections 11 to 13 performing the first process A. The Huffman decoding process is a decoding process of a variable length code for decoding encoded information for each frame from an encoded input bit stream. It is supposed that the main signal processing section 10 performing the second process B is an inverse MDCT processing section 101. The inverse MDCT process is a process performing an inverse MDCT process for a signal inversely quantized.

Figure 7:
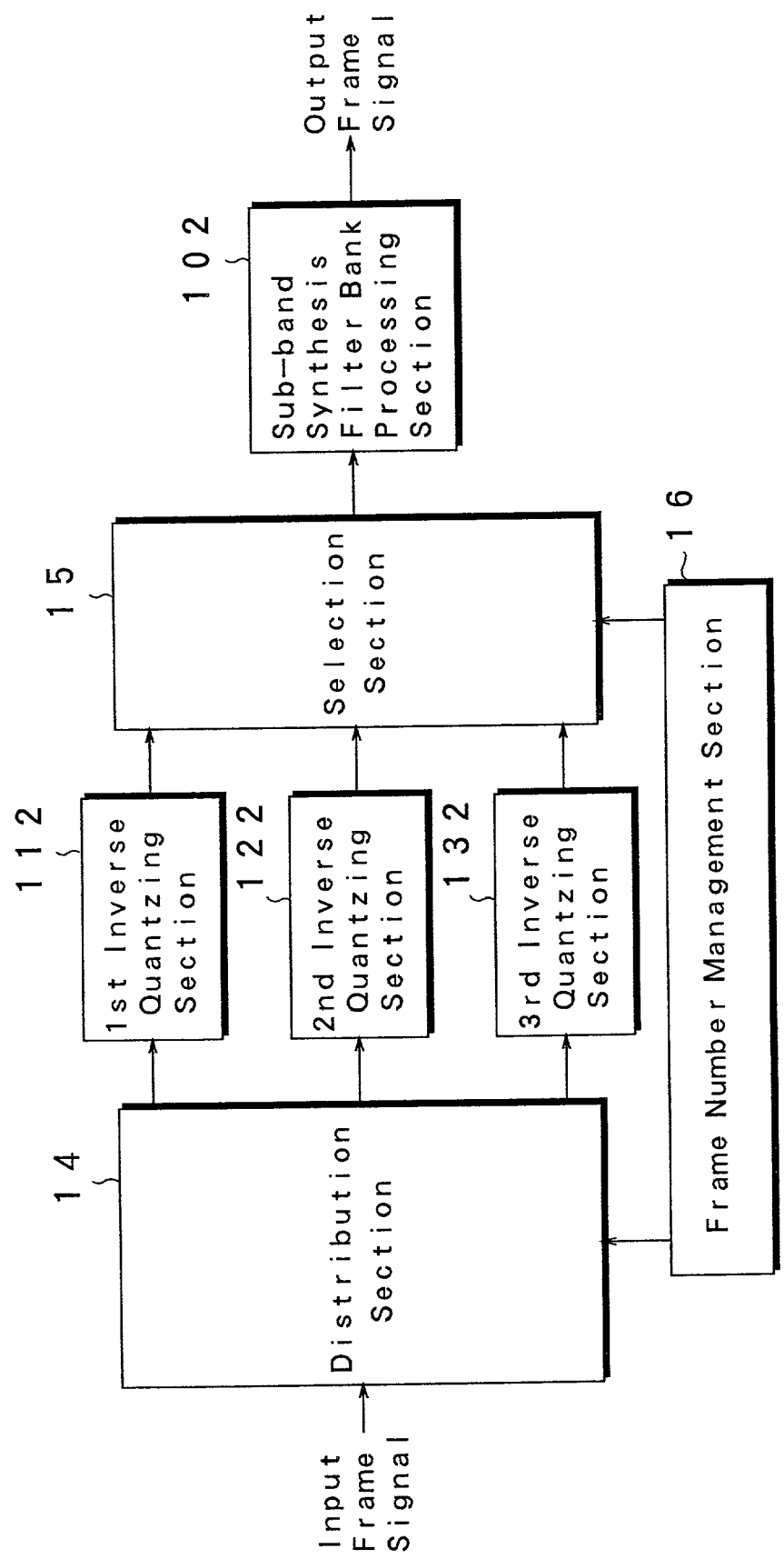
FIG. 7 is a block diagram showing a signal processing device performing audio signal decoding in accordance with another concrete example of Embodiment 1.

Another example of the audio decoding processing device is shown in FIG. 7. It can be set that the sub signal processing sections 11 to 13 are inverse quantizing sections 112, 122, 132 inversely quantizing encoded information and that the main signal processing section 10 is a sub-band synthesis filter bank processing section 102.

Figure 8:
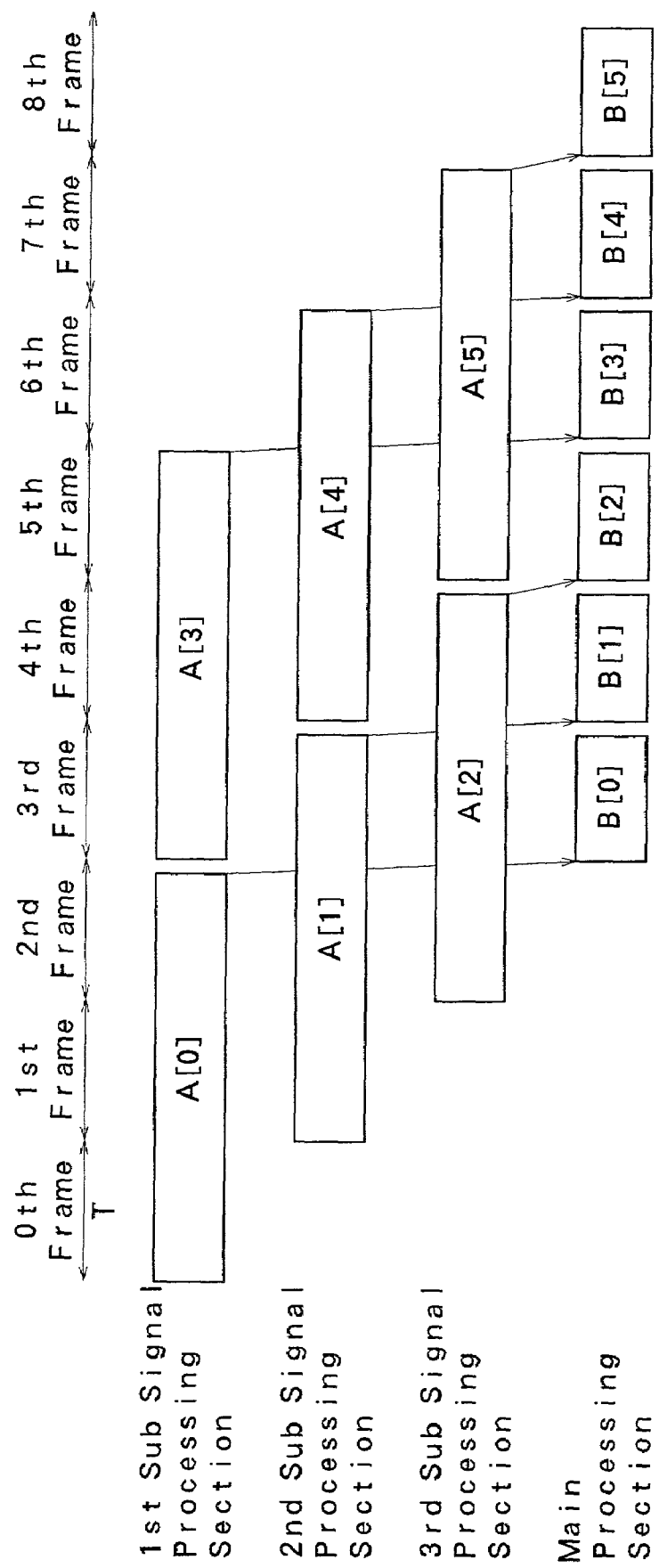
FIG. 8 is a time chart showing a flow of signal processing of Embodiment 1 of the present invention in order of time.

FIG. 8 is a view showing a time sequenced flow of the processing of the signal processing device of the present embodiment. Operations of the signal processing device will be explained below. First, the frame number management section 16 outputs a frame number incremented for each frame period to the distribution section 14 and the selection section 15. The distribution section 14 sends the frame signal to the (i+1)th sub signal processing section when the frame number is (N×t+i) (t and i are integers, and 0≦i<N). In this case, N is 3. As shown in FIG. 8, each frame signal is distributed to a predetermined sub signal processing section one after another.

The 0th frame signal is sent to the first sub signal processing section 11.

The first frame signal is sent to the second sub signal processing section 12.

The second frame signal is sent to the third sub signal processing section 13.

The third frame signal is sent to the first sub signal processing section 11.

The fourth frame signal is sent to the second sub signal processing section 12.

The fifth frame signal is sent to the third sub signal processing section 13.

In the respective sub signal processing sections 11 to 13, the first process A is executed for the frame signal distributed as described above within the time period 3T.

The selection section 15 then inputs the signal for which the first process A is performed from either one of the sub signal processing sections 11 to 13 and sends the signal to the main signal processing section 10. Here, when the frame number shown by the frame number management section 16 is (N×t+i), the signal outputted from the (i+1)th sub signal processing section is sent to the main signal processing section 10. The signal that the main signal processing section 10 receives at this time is the signal which the process A is performed for the signal inputted to the (i+1)th sub signal processing section at the time of the (N×(t−1)+i)th frame period. The main signal processing section 10 executes the second process B within the period T for the received signal for which the process A has been completed.

As shown in FIG. 8, in the 0th frame period, the 0th frame signal is inputted to the first sub signal processing section 11, and for this signal the process A [0] is started so that this process is completed within the period 3T.

In the first frame time, the first frame signal is inputted to the second sub signal processing section 12, and for this signal the process A [1] is started so that this process is completed within the period 3T.

In the second frame time, the second frame signal is inputted to the third sub signal processing section 13, and for this signal the process A [2] is started so that this process is completed within the period 3T.

In the third frame time, the third frame signal is inputted to the first sub signal processing section 11, and for this signal the process A [3] is started. At the same time in the main signal processing section 10, the process B [0] is started for the output signal from the first sub signal processing section 11 so that this process is completed within the period T.

By repeating this type of processing for each frame time one after another, the signal processing composed of the process A and the process B is performed for the frame signals inputted at the time T intervals so that the output frame signals are generated at the time T intervals. At this time, as is obvious from FIG. 8, in the main signal processing section 10 and the sub signal processing sections 11 to 13, the processing can be made parallel without dead time.

Since the processing employing the information generated in the past frame time is excluded in the first process A, the need to deliver a signal between the respective sub signal processing sections is eliminated, whereby the parallel processing can be efficiently performed.

In the present embodiment, since it is set that the processing amount of the process A is three times the processing amount of the process B, three sub signal processing sections are provided. When the processing amount of the process A is N times (N is a natural number) the processing amount of the process B, if N sub signal processing sections are provided, efficient parallel processing can be performed.

As described above, in the present embodiment, when the processing composed of the process A and the process B is parallel processed, even if there is a deviation in throughputs of the process A and the process B, parallel processing can be performed efficiently.

(Embodiment 2)

In the present embodiment, explained is a signal processing device that is intended for an audio signal and performs a first process A and then a second process B for an input frame signal that is framed for each time period T to generate an output frame signal. The present embodiment is explained in the setting that the processing amount of the process A is N times (here, N=2) the processing amount of the process B.

Figure 9:
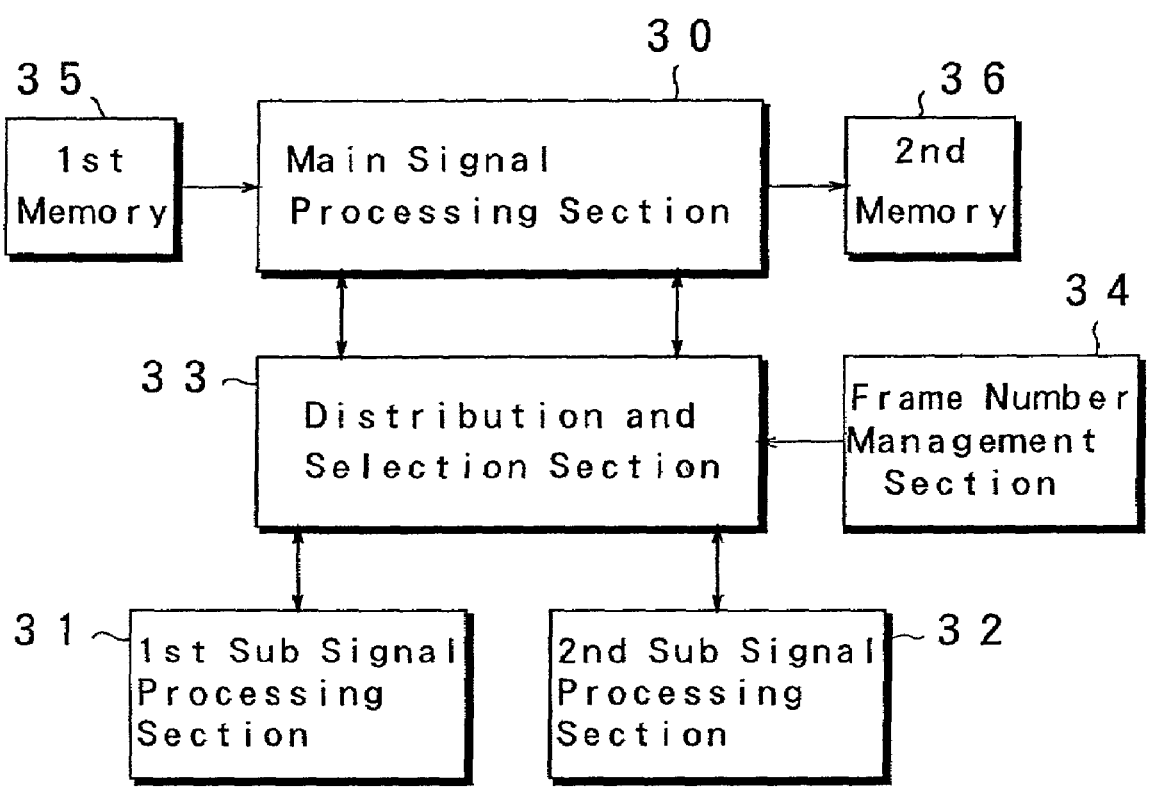
FIG. 9 is a block diagram showing a configuration of a signal processing device of Embodiment 2 of the present invention.

FIG. 9 is a block diagram showing a configuration of the signal processing device according to the present embodiment. The signal processing device has one main signal processing section 30 and first and second sub signal processing sections 31 and 32. A distribution and selection section 33 distributing and selecting to output each frame signal is provided between the main signal processing section 30 and the sub signal processing sections 31 and 32. A frame number management section 34 updates the frame number each time one frame period T elapses to output it to the distribution and selection section 33. A first memory 35 is a memory storing an input frame signal one after another, and a second memory 36 is a memory storing an output frame signal one after another. Here, it is supposed that the sub signal processing sections 31 and 32 have the capabilities to process the first process A within the time period (2×T), and the main signal processing section 30 has the capability to process the second process B within the time period T.

Here, similar to Embodiment 1, since the first process A has to start the process of the next frame time before the process of the past frame time is completed, it is necessary that the process A is the non-chain process. Conversely, the second process B can be the chain process. This is because the processing of the next frame time is always started after the process of the past frame time is completed. Therefore, similar to Embodiment 1 described above, it is possible to construct a signal processing device for decoding an audio signal, setting that the main signal processing section 30 performs an inverse MDCT process and the sub signal processing sections 31 and 32 perform a Huffman encoding process. It is possible to select the inverse quantize process as the first process A performed in the sub signal processing sections 31 and 32 and a sub-band synthesis filter bank process as the process B performed in the main signal processing section 30.

Figure 10:
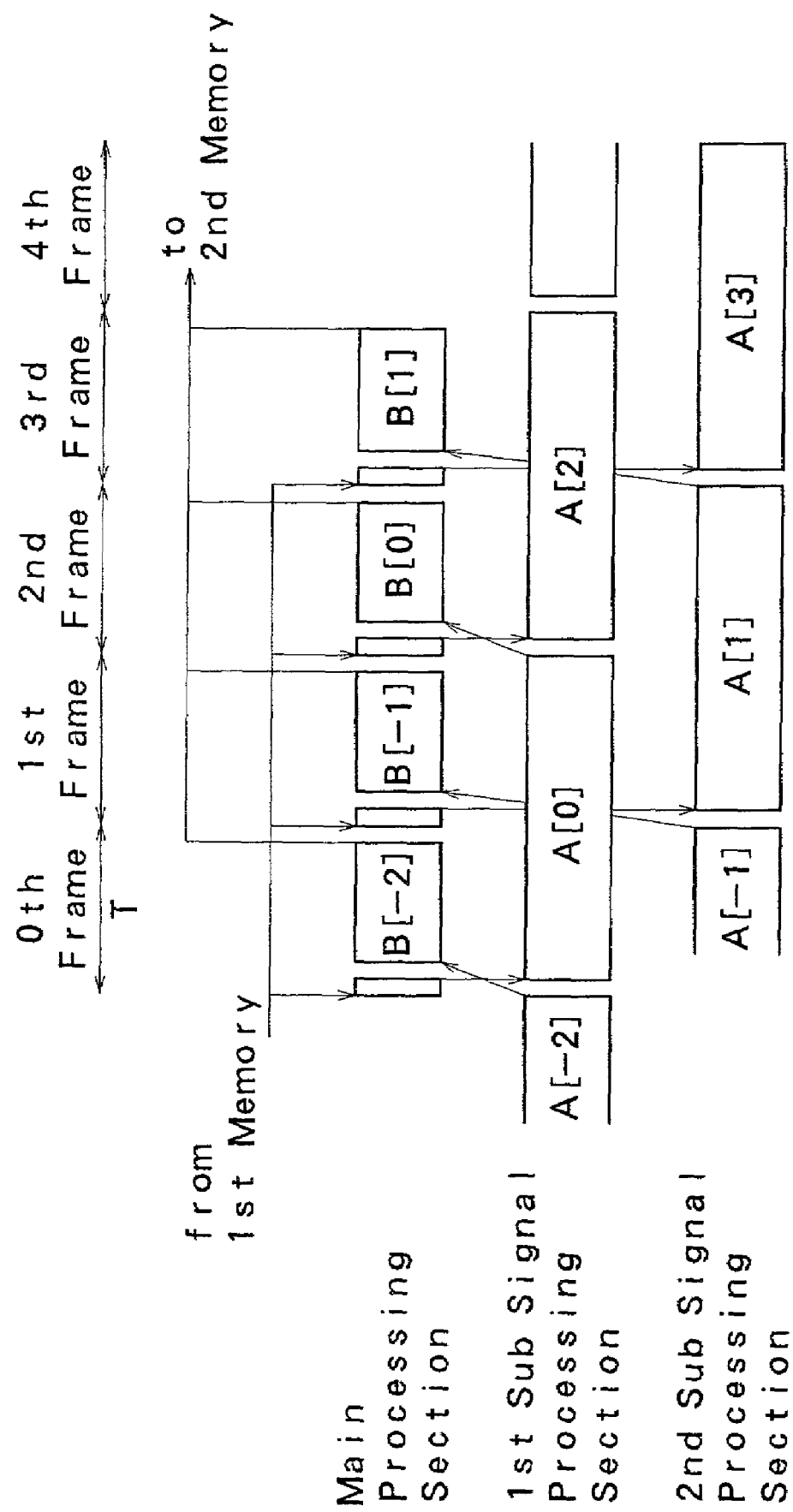
FIG. 10 is a time chart showing a flow of signal processing of Embodiment 2 of the present invention in order of time.

FIG. 10 is a view showing a flow of the processing of the signal processing device in the order of time. Operations of the signal processing device will be explained below, employing FIG. 9 and FIG. 10.

The main signal processing section 30 picks out the input frame signal of its frame time from the first memory 35 to output it to the distribution and selection section 33. A frame number is given to the distribution and selection section 33 from the frame number management section 34.

In an (even number)th frame time, its frame signal is outputted to the first sub signal processing section 31. The sub signal processing section 31 executes the process A for the input frame signal transferred as described above to complete it within the period (2×T).

Parallel to this, the main signal processing section 30 starts the process B for the signal received from the first sub signal processing section 31 to complete that process within the period T. This signal for which the process B is completed is sent to the second memory 36.

In an (odd number)th frame time, the distribution and selection section 33 receives the treated signal from the second sub signal processing section 32 to send it to the main signal processing section 30, and to send the frame signal of the frame time to the second sub signal processing section 32. The sub signal processing section 32 executes the process A for the input frame signal transferred to complete it within the period (2×T).

Parallel to this, the main signal processing section 30 starts the process B for the signal received from the second sub signal processing section 32 to complete that process within the period T. This signal for which the process B has been completed is sent to the second memory 36.

The signal that the main signal processing section 30 receives from the sub signal processing section 31 or 32 is the signal obtained by the process that the sub signal processing section performs the first process A for the frame signal inputted to that sub signal processing section before two frame time.

By repeating this type of processing for each frame time one after another, the signal processing composed of the process A and the process B is performed for the frame signals inputted at the time T intervals so that the output frame signals are generated at the time T intervals. At this time, as is obvious from FIG. 10, in the main signal processing section 30 and the sub signal processing sections 31 and 32, the processing can be made parallel without dead time.

Although the present embodiment is explained in a setting that the processing amount of the process A is two times the processing amount of the process B, when it is N times, N sub signal processing sections can be employed to construct the device. In this case, the distribution and selection section 33 is constructed so as to send, (N×t+i)th frame signal (i and t are integers, and 0≦i<N) obtained from the main signal processing section 30 for each time T to a (i+1)th sub signal processing section, and to receive the signal for which the first process A is completed for (N×(t−1)+i)th frame signal from the (i+1) sub signal processing section to send it to the main signal processing section 30. By this, when the processing composed of the process A and the process B is parallel processed, even if there is a deviation in the throughputs of the process A and the process B, parallel processing can be performed efficiently.

Constructing the process A so that the process A excludes a process employing the information generated in a past frame time eliminates the necessity to deliver a signal between the respective sub signal processing sections, whereby the processing parallel can be efficiently performed.

(Embodiment 3)

In the present embodiment, explained is a signal processing device that is intended for an audio signal and performs a first process A and then a second process B for an input frame signal that is framed for each time period T (T is a real number) to generate an output frame signal. Here, the present embodiment is explained in the setting that the processing amount of the process A is N times (here, N=3) the processing amount of the process B.

Figure 11:
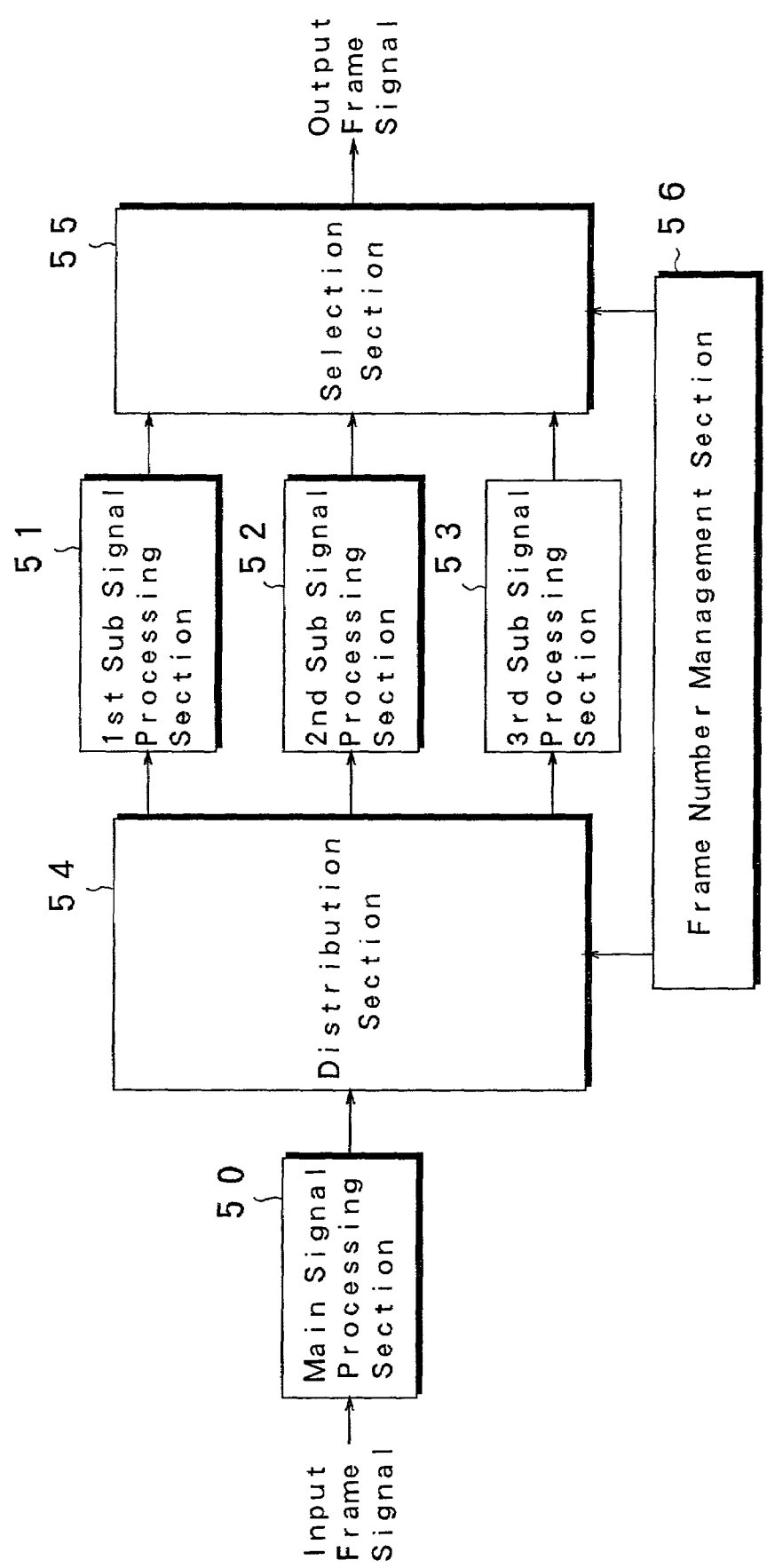
FIG. 11 is a block diagram showing a configuration of a signal processing device of Embodiment 3 of the present invention.

FIG. 11 shows a configuration of a signal processing device according to the present embodiment. The signal processing device has one main signal processing section 50 and first to third sub signal processing sections 51 to 53. A distribution section 54 distributes an output signal from the main signal processing section 50 to one of the sub signal processing sections 51 to 53 in accordance with the frame number. A selection section 55 selects the output signal of one of the sub signal processing sections 51 to 53 in accordance with the frame number to output it. A frame number management section 56 updates the frame number each time one frame period T elapses to give it to the distribution section 54 and the selection section 55. Here, it is supposed that the main signal processing section 50 has the capability to process the first process A within the time period T, and the respective sub signal processing sections 51 to 53 have the capabilities to process the process B within the time period (3×T).

Here, since with respect to the second process B, the process of the next frame time has to be started before the processing of the past frame time is completed, it is necessary that the process B is the non-chain process. Conversely, the first process A can be the chain process. This is because the processing of the next frame time is always started after the processing of the past frame time is completed.

The first digital signal may, for example, be a PCM signal of an audio signal, the second digital signal may be a compressed and encoded signal of an audio signal, the first process may contain a process converting the PCM signal into the information of a frequency spectrum, and the second process may contain a process compressing/encoding the information of the frequency spectrum.

Figure 12:
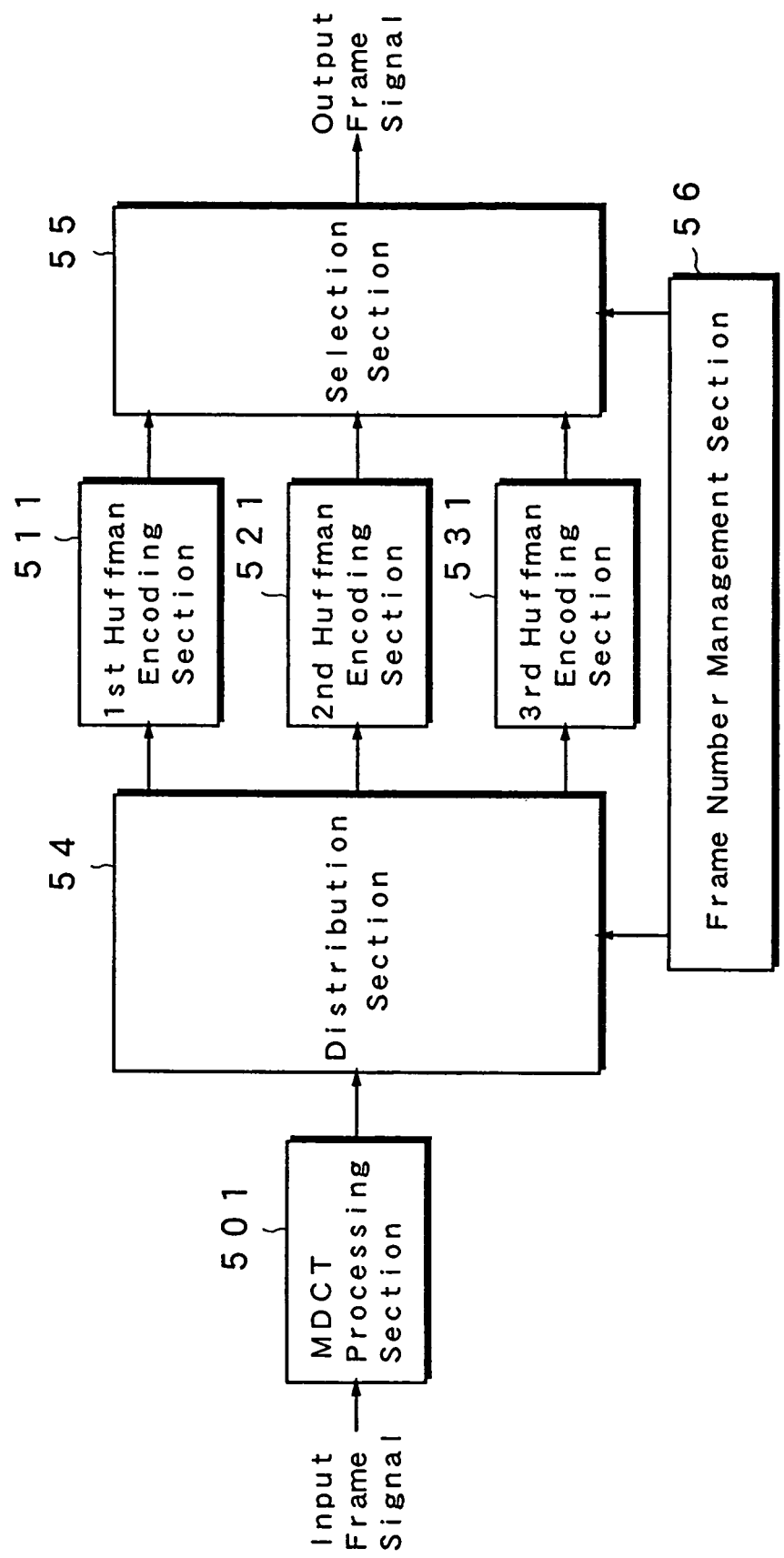
FIG. 12 is a block diagram showing a signal processing device performing audio signal encoding in accordance with a concrete example of Embodiment 3.

FIG. 12 is a block diagram showing a signal processing device performing an audio signal encoding process that is a concrete example of the present signal processing device. This audio signal encoding processing device can employ an MDCT processing section 501 as the main signal processing section 50 performing the first process, and first to third Huffman encoding sections 511, 521, and 531 as the sub signal processing sections 51 to 53 performing the second process as shown in FIG. 12. The MDCT process is a process converting the PCM signal in which the input is framed into a frequency spectrum signal while overlapping with the past PCM signal. The Huffman encoding process is, a variable length encoding process in which the present frame signal can be processed without employing the data generated at the time of the past frame processing.

Figure 13:
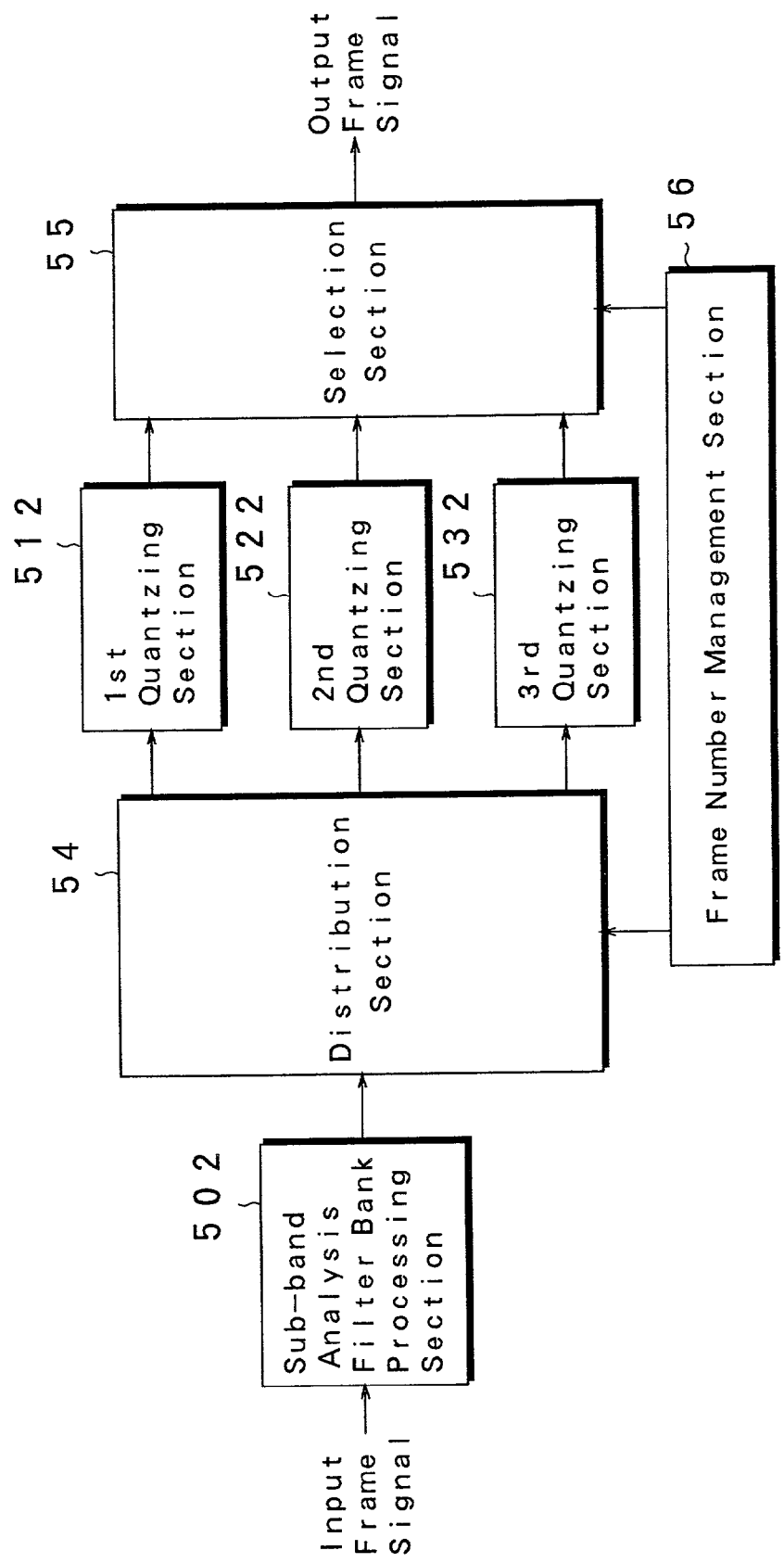
FIG. 13 is a block diagram showing a signal processing device performing audio signal encoding in accordance with another concrete example of Embodiment 3.

FIG. 13 shows another example of the audio encoding processing device. It can be set so that the main signal processing section 51 is a sub-band analysis filter bank processing section 502 and that the sub signal processing sections 51 to 53 are first to third quantizing sections 512, 522 and 532.

Figure 14:
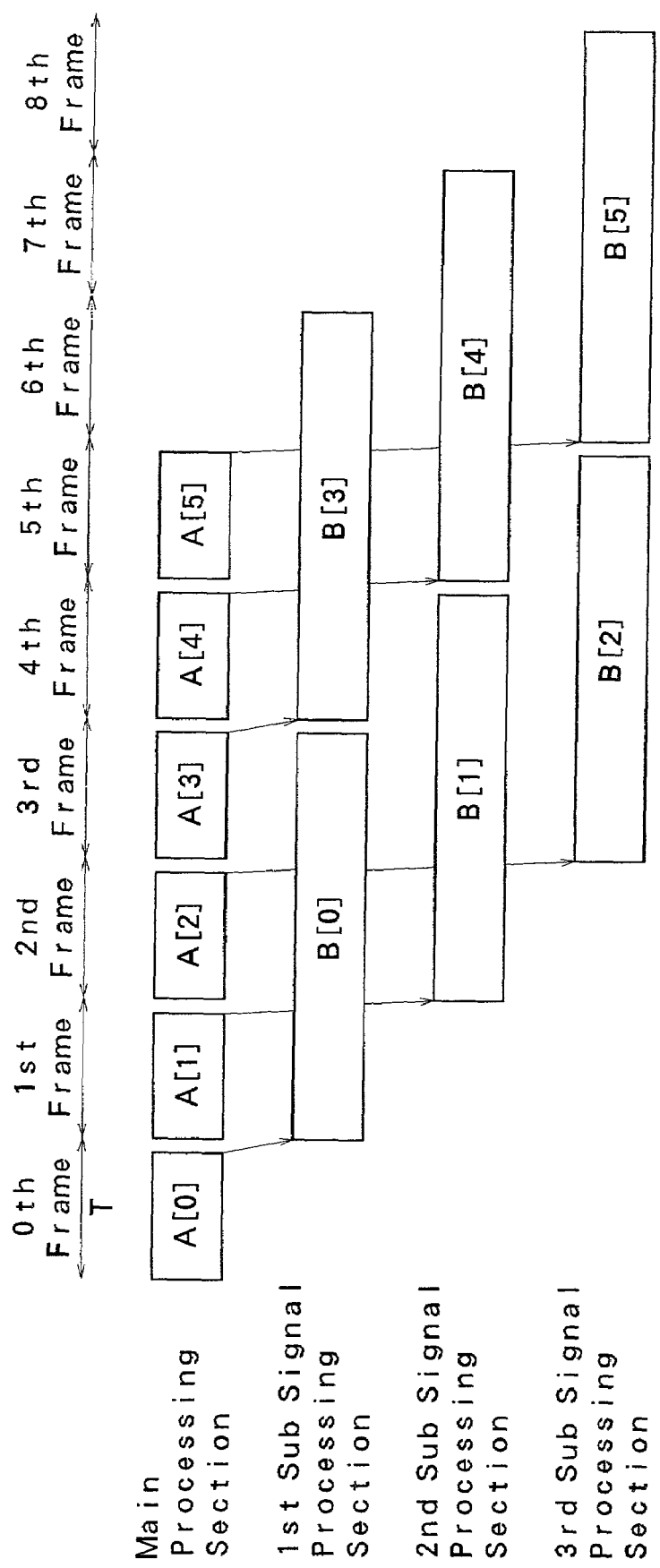
FIG. 14 is a block diagram showing a flow of the signal processing of Embodiment 3 of the present invention in order of time.

FIG. 14 is a view showing a flow of processing of the signal processing device in order of time. Operations of this signal processing device will be explained below, employing FIG. 11.

First, in the main signal processing section 50, the process A is performed for the input frame signal within the period T.

Then, the distribution section 54 sends the output signal from the main signal processing section 50 to the (i+1)th sub signal processing section when the frame number shown by the frame number management section 56 is (N×t+i) (t and i are integers, N is a natural number, and t≧0, and 0≦i<N). In this case, N=3.

That is:

When the frame number is 0, the output signal from the main signal processing section 50 is sent to the first sub signal processing section 51.

When the frame number is 1, it is sent to the second sub signal processing section 52.

When the frame number is 2, it is sent to the third sub signal processing section 53.

When the frame number is 3, it is sent to the first sub signal processing section 51.

When the frame number is 4, it is sent to the second sub signal processing section 52.

When the frame number is 5, it is sent to the third sub signal processing section 53.

As this, an output signal from the main signal processing section 50 is distributed to the predetermined sub signal processing section one after another.

In the sub signal processing sections 51 to 53, the process B is executed for the after-process A signal that is distributed as described above within the time period 3T.

The selection section 55 then inputs the signal for which the process A and the process B are performed from one of the sub signal processing sections 51 to 53 to output this processed signal. In general, when the frame number shown by the frame number management section 56 is (N×t+i), the signal outputted from the (i+1)th sub signal processing section is outputted. The signal outputted at this time becomes the signal which is obtained by performing the process B for the signal inputted to the (i+1)th sub signal processing section at the (N×(t−1)+i)th frame time. Here, N=3.

FIG. 14 is a view showing a flow of signal processing in the order of time. In the 0th frame time, the 0th frame signal is inputted to the main signal processing section 50, and for this signal the process A [0] is started so that this process is completed within the period T.

In the first frame time, the first frame signal is inputted to the main signal processing section 50, and for this signal the process A [1] is started. At the same time in the first sub signal processing section 51, the process B [0] is started for the output signal for which the process A [0] is completed from the main signal processing section 50 so that this process is completed within the period (3×T). Of course, the process A is completed within the period T.

In the second frame time, the second frame signal is inputted to the main signal processing section 50, and for this signal the process A [2] is started. At the same time in the second sub signal processing section 52, the process B [1] is started for the output signal for which the process A [1] is completed from the main signal processing section 50 so that this process is completed within the period (3×T). Of course, the process A is completed within the period T.

In the third frame time, the third frame signal is inputted to the main signal processing section 50, and for this signal the process A [3] is started. At the same time in the third sub signal processing section 53, the process B [2] is started for the output signal for which the process A [2] is completed from the main signal processing section 50 so that this process is completed within the period (3×T). Of course, the process A is completed within the period T.

In the fourth frame time, the fourth frame signal is inputted to the main signal processing section 50, and for this signal the process A [4] is started. At the same time in the first sub signal processing section 51, the process B [3] is started for the output signal for which the process A [3] is completed from the main signal processing section 50 so that this process is completed within the period (3×T). Of course, the process A is completed within the period T.

By repeating this type of processing for each frame time one after another, the signal processing composed of the process A and the process B is performed for the frame signals inputted at the time T intervals so that the output frame signals are generated at the time T intervals. At this time, as is obvious from FIG. 14, in the main signal processing section 50 and the sub signal processing sections 51 to 53, the processing can be made parallel without dead time.

Constructing the process B so that the process excludes employing the information generated in the past frame time eliminates the necessity to deliver a signal between the respective sub signal processing sections, whereby making the processing parallel can be efficiently performed.

In the present embodiment, since it is set that the processing amount of the process B is three times the processing amount of the process A, three sub signal processing sections are provided. When the processing amount of the process B is N times (N is a natural number) the processing amount of the process A, if N sub signal processing sections are provided, efficient parallel processing can be performed.

As described above, in the present embodiment, when the processing composed of the process A and the process B is parallel processed, even if there is a deviation in throughputs of the process A and the process B, parallel processing can be performed efficiently.

(Embodiment 4)

In the present embodiment, explained is a signal processing device that is intended for an audio signal and performs a first process A and then a second process B for an input frame signal that is framed for each time period T to generate an output frame signal. The present embodiment is explained in the setting that the processing amount of the process B is N times (here, N=2) the processing amount of the process A.

Figure 15:
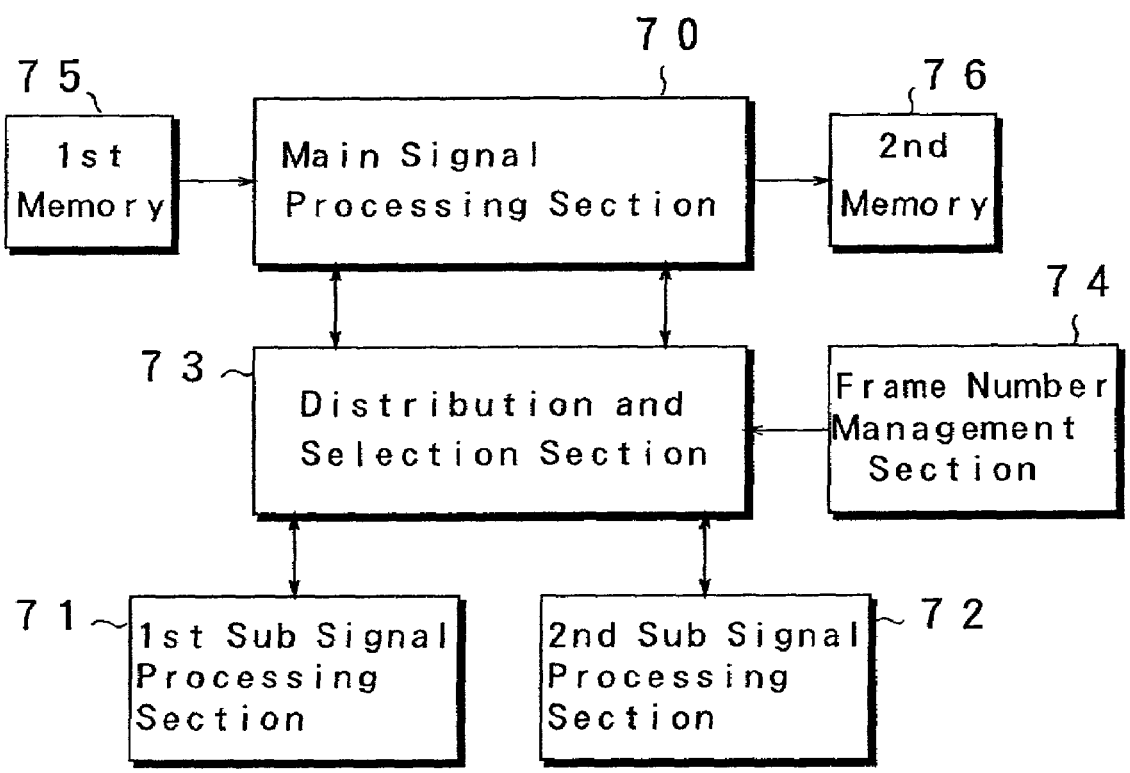
FIG. 15 is a block diagram showing a configuration of a signal processing device of Embodiment 4 of the present invention.

FIG. 15 is a block diagram showing a configuration of the signal processing device according to the present embodiment. The signal processing device has one main signal processing section 70 and first and second two sub signal processing sections 71 and 72. A distribution and selection section 73 distributing and selecting to output each frame signal is provided between the main signal processing section 70 and the sub signal processing sections 71 and 72. A frame number management section 74 updates a frame number each time one frame period T elapses to output it to the distribution and selection section 73. A first memory 75 is a memory storing an input frame signal one after another, and a second memory 76 is a memory storing an output frame signal one after another. Here, it is supposed that the sub signal processing sections 71 and 72 have the capabilities to process the first process B within the time period (2×T), and the main signal processing section 70 has the capability to process the process A within the time period T.

Here, similar to Embodiment 3, the first process A can be a process in which the information generated in the past frame time is employed, that is, the chain process. This is because the process of the next frame time is always started after the processing of the past frame time is completed. Conversely, since the second process B has to start the process of the next frame time before the process of the past frame time is completed, it is necessary that the process B is the non-chain process. Therefore, similar to Embodiment 3 described above, it is possible to construct an audio coding processing device performing an MDCT process as the main signal processing section 70 and the Huffman encoding process as the sub signal processing sections 31 and 32. It is possible to select a sub-band analysis filter bank process as the process A performed in the main signal processing section 70 and a quantize process as the process B performed in the sub signal processing section 30.

FIG. 16 is a view showing a flow of the processing of the signal processing device in the order of time. Operations of the signal processing device will be explained below, employing FIG. 15 and FIG. 16.

The main signal processing section 70 picks out the input frame signal of its frame time from the first memory 75 and performs the process A for this frame signal. This process A is completed within the period T. This after-process A signal is outputted to the distribution and selection section 73. A frame number has been given to the distribution and selection section 73 from the frame number management section 74, and the frame signal is outputted to the first sub signal processing section 71 in an (even number)th frame time.

Parallel to this, in the second sub signal processing section 72, the process B is started for the after-process A signal which exists before one frame time, and this process is completed within the period 2×T. This after-process B signal is sent to the second memory 76 via the distribution and selection section 73 and the main signal processing section 70.

In an (odd number)th frame time, a frame signal of its time is inputted from the first memory 75 to the main signal processing section 70, and for this signal the process A is started so that this process is completed within the period T. This after-process A signal is sent to the second sub signal processing section 72 via the distribution and selection section 73.

Parallel to this, in the first sub signal processing section 71, the process B is started for the after-process A signal which exists before one frame time so that this process is completed within the period 2×T. This after-process B signal is sent to the second memory 76 via the distribution and selection section 73 and the main signal processing section 70.

At this time, the signal that the main signal processing section 70 receives from the sub signal processing section 71 or 72 is the signal obtained by the process that the sub signal processing section performs the process B for the frame signal inputted to this sub signal processing section before two frame time.

By repeating this type of processing for each frame time one after another, the signal processing composed of the process A and the process B is performed for the frame signals inputted at the time T intervals so that the output frame signals are generated at the time T intervals. At this time, as is obvious from FIG. 16, in the main signal processing section 70 and the sub signal processing sections 71 and 72, the processing can be made parallel without dead time.

As described above, in the present embodiment, when the processing composed of the process A and the process B is parallel processed, even if there is a deviation in throughputs of the process A and the process B, parallel processing can be performed efficiently.

Constructing the process B so that the process B does not contain a process employing the information generated in a past frame time eliminates the necessity to deliver a signal between the respective sub signal processing sections, whereby making the processing parallel can be efficiently performed.

In the respective embodiments described above, it is premised that the operations of the sub signal processing sections are defined by a program stored in a commend memory and are operated by the same program. That is, in a signal processing device, a plurality of sub signal processing sections operate exactly the same. Accordingly, it is desired that the memory needed in the processing performed in the sub signal processing sections is smaller than the memory needed in the processing performed in the main signal processing section.

The need to deliver a signal between the respective sub signal processing sections is eliminated by not performing parallel processing in the process in which a process employing the information generated in a past frame time is contained and performing parallel processing in the process in which a process employing the information generated in a past frame time is not contained, whereby parallel processing and pipeline processing can be efficiently performed, and the power consumption can be reduced.

FIG. 17 is an outlined view showing one example of a portable type apparatus employing a signal processing device in accordance with either one of the embodiments described above. This portable type apparatus is, for example, an apparatus for encoding and decoding to reproduce audio data, such as MP3, AAC, or the like. This apparatus is provided with a microphone 81 as an input device, an input section 82, an output section 83 amplifying a decoded signal, a speaker 84, a memory 85, and a battery 86 in addition to that signal processing device 87 as shown in the drawing. The signal processing device 87 is constructed, including an encoding section 801 performing an encoding process of an audio signal in accordance with Embodiment 3 or 4 described above and a decoding section 802 performing a decoding process in accordance with Embodiment 1 or 2. The memory 85 is a memory holding audio data and is constructed so as to encode the data inputted thereto to write and decode the data written to output. The memory 85 can be constructed as a memory card that is small in size and is easy to attach or detach. With this, efficiently paralleling to encode and decode is possible, whereby advantageous effects can be produced wherein drastic low power consumption is achieved, and possible operating time can be prolonged by one time charge of the portable type apparatus.

What is claimed is:

1. A portable audio device having a signal processing device for performing digital audio decoding comprising:
    a distribution section which divides a first digital signal framed for each predetermined time interval to (N×t+i) th frame signals (i and t are integers, N is a natural number greater than 1, and 0≦i<N) and distributes said frame signals for each frame interval one after another;
    first to Nth sub signal processing sections each of which is given said frame signals from said distributing section, and each of which completes a first process within a period (N×T) (T is a real number);
    a selection section which selects one of a processed signal outputted from said first to Nth sub signal processing sections for each frame interval one after another; and
    a main signal processing section which converts a signal inputted from said selection section into a second digital signal by completing a second process within a period T;
    wherein said first digital signal is a compressed and encoded signal of an audio signal;
    said second digital signal is a PCM signal of an audio signal;
    said first process contains a process picking out information from the compressed and encoded signal to convert the information into information of a frequency spectrum; and
    said second process contains a process converting said information of said frequency spectrum into said PCM signal having a time basis.

2. The signal processing device according to claim 1, wherein
    said first process contains a decoding process of a variable length code; and
    said second process contains an inverse MDCT process.

3. The signal processing device according to claim 1, wherein said first process contains an inverse quantizing process inversely quantizing said compressed and encoded signal, and said second process contains a sub-band synthesis filter bank process.

4. The signal processing device according to claim 1, wherein a division is made for said first process and said second process so that the calculation period necessary for said first process is N times a calculation period necessary for said second process.

5. A portable audio device having a signal processing device for performing digital audio decoding comprising:

first to Nth sub signal processing sections each of which is given (N×t+i)th frame signals (i and t are integers, N is a natural number greater than 1, and 0≦i<N) of a first digital signal framed for each predetermined time interval and each of which completes a first process within a period (N×T) (T is a real number);

a first memory which stores said frame signal of said first digital signal one after another;

a main signal processing section which converts a signal processed in said (i+1)th sub signal processing section into a second digital signal by completing a second process within a period T;

a second memory which stores said frame signal of said second digital signal one after another; and a distribution and selection section which sends the (N×t+i)th frame signal (i and t are integers, and 0≦i<N) obtained from said main signal processing section to said (i+1)th sub signal processing section, receives the signal on which said first process has been performed for the (N×(t−1)+i)th frame signal from the (i+1)th sub signal processing section, and outputs said signal to said main signal processing section;

wherein said first to Nth sub signal processing sections are connected to said distribution and selection section, performs the first process for said frame signal received from said distribution and selection section, and sends the after-process signal to said distribution and selection section; and said main signal processing section is connected to said first and second memories, picks out said frame signal from said first memory for each time interval T one after another to output said frame signal to said distribution and selection section, and performs said second process for said signal received from said distribution and selection section to store this after-process signal in said second memory;

said first digital signal is a compressed and encoded signal of an audio signal;

said second digital signal is a PCM signal of an audio signal;

said first process contains a process picking out information from the compressed and encoded signal to convert the information into information of a frequency spectrum; and said second process contains a process converting said information of said frequency spectrum into said PCM signal having a time basis.

6. A signal processing device for performing digital audio encoding comprising:

a main signal processing section which is given (N×t+i)th frame signals (i and t are integers, N is a natural number greater than 1, and 0≦i<N) of a first digital signal framed for each predetermined time interval and which completes a first process within a period T (T is a real number);

a distribution section which divides said frame signal outputted from said main signal processing section into said first to Nth frame signal for each frame interval one after another;

first to Nth sub signal processing sections each of which is given the (i+1)th processed frame signal from said distribution section and converts said frame signal into a second digital signal by completing a second process within a period (N×T); and a selection section which selects one of the after-process signals outputted from said first to Nth sub signal processing sections for each frame interval one after another;

wherein said first digital signal is a PCM signal of an audio signal;

said second digital signal is a compressed and encoded signal of an audio signal;

said first process contains a process converting said PCM signal into information of a frequency spectrum; and said second process contains a process encoding and compressing said information of said frequency spectrum.

7. The signal processing device according to claim 6, wherein said first process contains a MDCT process; and said second process contains a Huffman coding process.

8. The signal processing device according to claim 6, wherein said first process contains a sub-band analysis filter bank process; and said second process contains a quantizing process.

9. The signal processing device according to claim 6, wherein a division is made for said first process and said second process so that a calculation period necessary for said second process is N times a calculation period necessary for said first process.

10. The signal processing device for performing digital audio encoding comprising:

a main signal processing section which is given (N×t+i)th frame signals (i and t are integers, N is a natural number greater than 1, and 0≦i<N) of a first digital signal framed for each predetermined time interval and which completes a first process within a period T (T is a real number);

a first memory stores said frame signal of said first digital signal one after another;

first to Nth sub signal processing sections each of which is given the (i+1)th frame signal after the first digital signal has been processed in said main signal processing section and converts the frame signal into a second digital signal by completing a second process within a period (N×T):

a second memory stores said frame signal of said second digital signal one after another; and a distribution and selection section which sends a signal obtained from said main signal processing section to said (i+1)th sub signal processing section, receives a signal which said second process has been performed for the (N×(t−1)+i)th frame signal from said (i+1)th sub signal processing section, and outputs said signal to said main signal processing section;

wherein said main signal processing section is connected to said first and second memories, picks out a frame signal from said first memory for each time interval T one after another, performs said first process for said (N×t+i)th frame signal to output said frame signal to said distribution and selection section, and stores this after-process signal received from said distribution and selection section in said second memory;

said first to Nth sub signal processing sections which perform said second process for said frame signal received from said distribution and selection section, and sends the after-process signal to said distribution and selection section;

said first digital signal is a PCM signal of an audio signal;

said second digital signal is a compressed and encoded signal of an audio signal;

said first process contains a process converting said PCM signal into information of a frequency spectrum; and said second process contains a process encoding and compressing said information of said frequency spectrum.

* * * * *